(12) United States Patent
Van Laanen et al.

(10) Patent No.: US 8,425,085 B2
(45) Date of Patent: Apr. 23, 2013

(54) THERMAL MANAGEMENT OF LED-BASED LIGHTING SYSTEMS

(75) Inventors: Peter Van Laanen, Boulder, CO (US); Jeffrey Bisberg, Boulder, CO (US); Neil Cannon, Eldorado Springs, CO (US); Tracy Earles, Boulder, CO (US)

(73) Assignee: Albeo Technologies, Inc., Boulder, CO (US)

( * ) Notice: Subject to any disclaimer, the term of this patent is extended or adjusted under 35 U.S.C. 154(b) by 636 days.

(21) Appl. No.: 12/431,674

(22) Filed: Apr. 28, 2009

(65) Prior Publication Data

US 2009/0290348 A1  Nov. 26, 2009

Related U.S. Application Data

(63) Continuation-in-part of application No. 11/735,903, filed on Apr. 16, 2007, now Pat. No. 7,806,574, and a continuation-in-part of application No. 11/959,335, filed on Dec. 18, 2007.

(60) Provisional application No. 61/048,461, filed on Apr. 28, 2008, provisional application No. 60/744,935, filed on Apr. 16, 2006, provisional application No. 61/048,469, filed on Apr. 28, 2008, provisional application No. 60/984,075, filed on Oct. 31, 2007, provisional application No. 60/870,607, filed on Dec. 18, 2006, provisional application No. 60/870,608, filed on Dec. 18, 2006.

(51) Int. Cl.
*F21V 29/00* (2006.01)

(52) U.S. Cl.
USPC ........... 362/294; 362/800; 362/218; 362/227; 362/249.02; 362/249.11; 362/311.02

(58) Field of Classification Search ................ 362/800, 362/547, 218, 264, 294, 345, 373, 227, 235, 362/237, 241, 243, 246, 247, 248, 249.02, 362/249.11, 296.01, 300, 311.02
See application file for complete search history.

(56) References Cited

U.S. PATENT DOCUMENTS

| 4,814,667 A | 3/1989 | Tanaka |
| 5,113,232 A | 5/1992 | Itoh et al. |

(Continued)

FOREIGN PATENT DOCUMENTS

| WO | WO 2005/024291 | 3/2005 |
| WO | WO 2005083804 | 9/2005 |

(Continued)

OTHER PUBLICATIONS

Bisberg, J. (Albeo Technologies, Inc. president), Sales offer, email dated Jun. 28, 2006, 1 page, unpublished.

(Continued)

*Primary Examiner* — Evan Dzierzynski
*Assistant Examiner* — Danielle Allen
(74) *Attorney, Agent, or Firm* — Lathrop & Gage LLP

(57) ABSTRACT

An LED-based lighting system includes a housing forming one or more apertures, a PCB having conductors on its front-side, and one or more LEDs mounted with the conductors. The PCB mounts with the conductors proximate to a top surface of the housing such that the LEDs emit light through the apertures, and heat generated by the one or more LEDs primarily dissipates through the conductors to the housing. A retrofit apparatus for a light fixture includes a PCB having conductors on its front-side thereof, and one or more LEDs mounted with the conductors. The PCB mounts with the conductors proximate to a surface of a mounting bracket that is configured for mounting to the light fixture, such that when the bracket mounts to the light fixture, heat generated by the one or more LEDs primarily dissipates through the conductors and the structural element to the light fixture.

17 Claims, 10 Drawing Sheets

U.S. PATENT DOCUMENTS

| | | | |
|---|---|---|---|
| 5,136,483 A | 8/1992 | Schoniger et al. | |
| 5,241,360 A * | 8/1993 | Key et al. | 356/5.12 |
| 5,278,432 A | 1/1994 | Ignatius et al. | |
| 5,561,346 A | 10/1996 | Byrne | |
| 5,655,830 A | 8/1997 | Ruskouski | |
| 5,785,418 A | 7/1998 | Hochstein | |
| 5,857,767 A | 1/1999 | Hochstein | |
| 6,045,240 A * | 4/2000 | Hochstein | 362/294 |
| 6,224,216 B1 | 5/2001 | Parker et al. | |
| 6,354,714 B1 | 3/2002 | Rhodes | |
| 6,428,189 B1 | 8/2002 | Hochstein | |
| 6,499,859 B2 | 12/2002 | Petzl et al. | |
| 6,561,678 B2 * | 5/2003 | Loughrey | 362/282 |
| 6,582,100 B1 | 6/2003 | Hochstein et al. | |
| 6,590,343 B2 | 7/2003 | Pederson | |
| 6,609,804 B2 | 8/2003 | Nolan et al. | |
| 6,678,171 B1 | 1/2004 | Drews et al. | |
| 6,739,966 B2 | 5/2004 | DeRegge | |
| 6,894,901 B2 | 5/2005 | Simon | |
| 6,966,677 B2 | 11/2005 | Galli | |
| 6,999,318 B2 | 2/2006 | Newby | |
| 7,033,036 B2 | 4/2006 | Pederson | |
| 7,080,921 B2 | 7/2006 | Feldstein | |
| 7,086,765 B2 * | 8/2006 | Wehner | 362/511 |
| 7,114,831 B2 | 10/2006 | Popovich et al. | |
| 7,139,617 B1 | 11/2006 | Morgan et al. | |
| 7,196,459 B2 | 3/2007 | Morris | |
| 7,198,387 B1 | 4/2007 | Gloisten et al. | |
| 7,201,511 B2 | 4/2007 | Moriyama et al. | |
| 7,235,878 B2 | 6/2007 | Owen et al. | |
| 7,236,366 B2 | 6/2007 | Chen | |
| 7,274,043 B2 | 9/2007 | Erchak et al. | |
| 7,281,820 B2 | 10/2007 | Bayat et al. | |
| 7,296,912 B2 | 11/2007 | Beauchamp | |
| 7,344,279 B2 | 3/2008 | Mueller et al. | |
| 7,344,284 B2 | 3/2008 | Lynam et al. | |
| 7,348,604 B2 | 3/2008 | Matheson | |
| 7,388,753 B2 | 6/2008 | Liu et al. | |
| 7,413,326 B2 | 8/2008 | Tain et al. | |
| 7,427,152 B2 | 9/2008 | Erion et al. | |
| 7,614,767 B2 * | 11/2009 | Zulim et al. | 362/296.01 |
| 8,042,978 B2 | 10/2011 | Lu et al. | |
| 2003/0048641 A1 | 3/2003 | Alexanderson et al. | |
| 2003/0189829 A1* | 10/2003 | Shimizu et al. | 362/240 |
| 2004/0120160 A1* | 6/2004 | Natsume | 362/544 |
| 2004/0184272 A1 | 9/2004 | Wright et al. | |
| 2004/0264141 A1 | 12/2004 | Spryshak | |
| 2005/0082965 A1 | 4/2005 | Huang et al. | |
| 2005/0085011 A1 | 4/2005 | Lee | |
| 2005/0157469 A1 | 7/2005 | Gorak | |
| 2005/0254241 A1* | 11/2005 | Harwood | 362/231 |
| 2005/0287050 A1* | 12/2005 | Rabellino et al. | 422/177 |
| 2006/0139932 A1 | 6/2006 | Park | |
| 2006/0268527 A1 | 11/2006 | Tanaka et al. | |
| 2007/0047243 A1 | 3/2007 | Hacker et al. | |
| 2007/0063342 A1 | 3/2007 | Chen et al. | |
| 2007/0081340 A1 | 4/2007 | Chung et al. | |
| 2007/0081342 A1 | 4/2007 | Szeto | |
| 2007/0121326 A1 | 5/2007 | Nall et al. | |
| 2007/0139930 A1 | 6/2007 | Spivak | |
| 2007/0147046 A1 | 6/2007 | Arik et al. | |
| 2007/0189012 A1 | 8/2007 | Huang et al. | |
| 2007/0230185 A1 | 10/2007 | Shuy | |
| 2007/0236935 A1 | 10/2007 | Wang | |
| 2007/0247851 A1 | 10/2007 | Villard | |
| 2007/0247853 A1 | 10/2007 | Dorogi | |
| 2007/0259160 A1 | 11/2007 | Huang | |
| 2007/0268703 A1 | 11/2007 | Gasquet et al. | |
| 2007/0285926 A1 | 12/2007 | Maxik | |
| 2007/0291490 A1 | 12/2007 | Tajul et al. | |
| 2008/0002410 A1 | 1/2008 | Burton et al. | |
| 2008/0007954 A1 | 1/2008 | Li | |
| 2008/0137308 A1 | 6/2008 | MacDonald et al. | |
| 2008/0137325 A1 | 6/2008 | Pastore | |
| 2008/0137333 A1 | 6/2008 | Tamaoki et al. | |
| 2008/0144291 A1 | 6/2008 | Hu et al. | |
| 2008/0158887 A1 | 7/2008 | Zhu et al. | |
| 2008/0170371 A1 | 7/2008 | Lai | |
| 2008/0170380 A1 | 7/2008 | Pastore | |
| 2008/0174968 A1 | 7/2008 | Feng et al. | |
| 2008/0174969 A1 | 7/2008 | Sandwall | |
| 2008/0186682 A1 | 8/2008 | Sugimura | |
| 2008/0192441 A1 | 8/2008 | Refai-Ahmed et al. | |
| 2008/0192458 A1 | 8/2008 | Li | |
| 2008/0205054 A1 | 8/2008 | Ho | |
| 2008/0205060 A1 | 8/2008 | Chien | |
| 2008/0211427 A1 | 9/2008 | Budde et al. | |
| 2008/0212325 A1 | 9/2008 | Wang | |
| 2008/0212333 A1 | 9/2008 | Chen | |
| 2008/0213094 A1 | 9/2008 | Okimura | |

FOREIGN PATENT DOCUMENTS

| | | |
|---|---|---|
| WO | WO 2005119633 | 12/2005 |
| WO | WO 2008007142 A1 | 1/2008 |
| WO | WO 2008/093978 | 8/2008 |

OTHER PUBLICATIONS

U.S. Appl. No. 11/735,903 Pre Appeal Brief Request for Review filed Apr. 29, 2010, 7 pages.

U.S. Appl. No. 11/735,903 Notice of Panel Decision from Pre-Appeal Brief Review mailed May 27, 2010, 2 pages.

U.S. Appl. No. 11/735,903, Office Action mailed Jul. 30, 2010, 11 pages.

U.S. Appl. No. 11/735,903, Response to Office Action filed Aug. 12, 2010, 8 pages.

U.S. Appl. No. 11/735,903, Notice of Allowance mailed Aug. 24, 2010, 6 pages.

Office Action issued in related U.S. Appl. No. 11/735,903, dated Dec. 29, 2009, 11 pages.

Response to Office Action issued in related U.S. Appl. No. 11/735,903, filed Mar. 1, 2010, 16 pages.

Advisory Action issued in related U.S. Appl. No. 11/735,903, dated Mar. 19, 2010, 4 pages.

U.S. Appl. No. 11/735,903, Office Action mailed May 27, 2009, 10 pages.

U.S. Appl. No. 11/959,335, Office Action dated Jan. 7, 2013, 9 pages.

* cited by examiner

FIG. 14
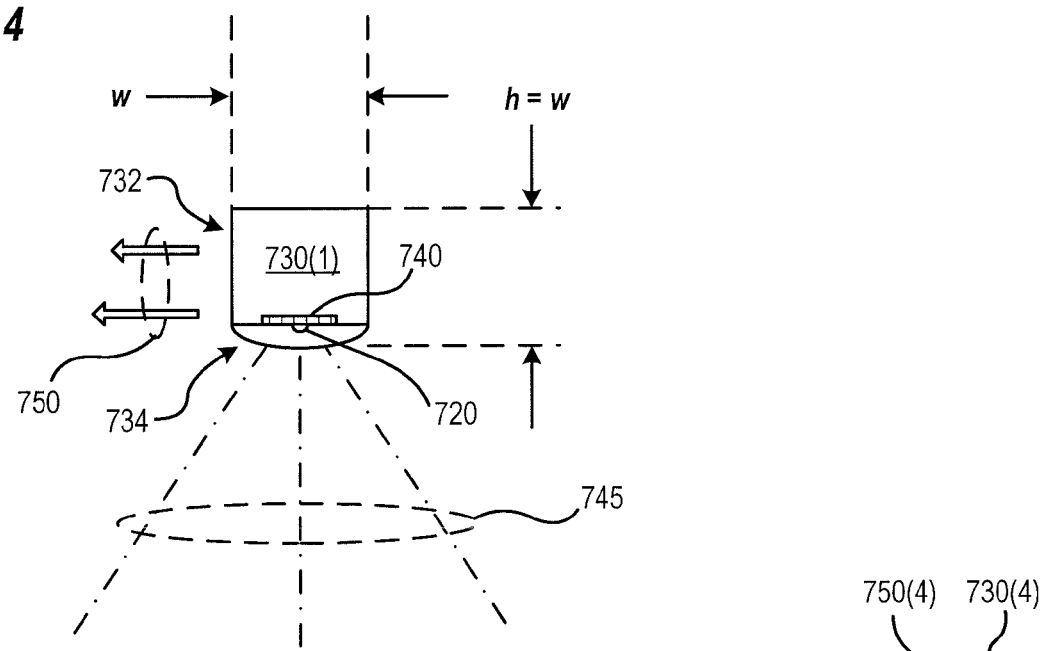
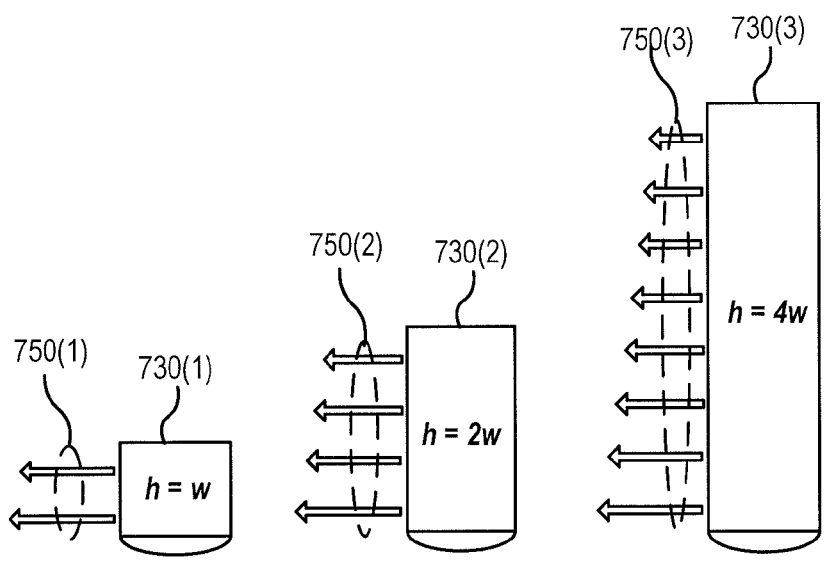
FIG. 15

THERMAL MANAGEMENT OF LED-BASED LIGHTING SYSTEMS

CROSS-REFERENCE TO RELATED APPLICATIONS

This application claims the benefit of priority of U.S. Provisional Patent Applications Nos. 61/048,469, filed 28 Apr. 2008 and 61/048,461, filed 28 Apr. 2008. This application is also a continuation-in-part application of U.S. patent application Ser. No. 11/735,903, filed 16 Apr. 2007, now U.S. Pat. No. 7,806,574 which claims priority to U.S. Provisional Patent Application No. 60/744,935, filed 16 Apr. 2006. This application is also a continuation-in-part application of U.S. patent application Ser. No. 11/959,335, filed 18 Dec. 2007, which claims priority to U.S. Provisional Patent Applications Nos. 60/984,075, filed 31 Oct. 2007, 60/870,607, filed 18 Dec. 2006, and 60/870,608, filed 18 Dec. 2006. All of the above-identified patent applications are incorporated herein by reference in their entireties.

BACKGROUND

Light-emitting diode ("LED") based lighting systems are currently increasing in popularity for a number of reasons. Compared to incandescent lighting (based on filament heating), LED-based lighting systems are much more efficient at conversion of input power to light energy. Compared to fluorescent lighting (based on absorption and reemission of photons generated by a plasma), LED-based lighting systems have longer lifetimes, operate without noticeable flickering and humming, can be dimmed by reducing the operating current thereto, and do not require high voltage electronics.

Efficient removal of heat is important in LED-based lighting systems. Despite its efficiency, heat is generated by an LED during operation, and concentrates in a small volume, potentially increasing the LED's operating temperature significantly. The operating lifetime of an LED is often strongly correlated to its operating temperature, such that a small increase (e.g., a few degrees Celsius) in operating temperature may degrade operating lifetime by hundreds or thousands of hours.

FIG. 1 shows a portion of a prior art LED-based lighting system 10. LEDs 20 and other circuit components 30 mount on a printed circuit board ("PCB") 40, which in turn mounts on a heat sink 60 (not all LEDs 20 and components 30 are labeled in FIG. 1 for clarity of illustration). PCB 40 includes a metal core 45. A front side 42 of metal core PCB 40 has a dielectric layer 50 and conductors 55 that electrically connect LEDs 20 with circuit components 30 and with external power supplies. The metal core of PCB 40 facilitates heat transfer such that heat generated by LEDs 20 flows through PCB 40 (from front side 42 to a back side, hidden in the perspective of FIG. 1) to heat sink 60. System 10 may also include thermal grease (hidden in the perspective of FIG. 1) between the back side of PCB 40 and heat sink 60 to further facilitate heat transfer.

In a thermal test of system 10, with LEDs 20 being ½ watt LEDs and operated at a given test current, a $\Delta T$ (difference in temperature) of 5 to 6 degrees Celsius was measured between metal leads of LEDs 20 and heat sink 60.

Another PCB substrate material that has been utilized for LED-based lighting systems is ceramic material, which can be costly and can introduce manufacturing difficulties, such as low yield when substrates are singulated (separated into single units during fabrication) and difficulty in reworking of mounted components.

SUMMARY

In an embodiment, an LED-based lighting system includes a housing forming one or more apertures, a printed circuit board ("PCB") having conductors on a front-side thereof, and one or more LEDs mounted with the conductors. The PCB is mounted with the conductors proximate to and thermally coupling with a surface of the housing such that the LEDs emit light through the apertures. Heat generated by the one or more LEDs primarily dissipates through the conductors to the housing.

In an embodiment, an LED-based lighting system includes a housing forming one or more apertures, and one or more LEDs mounted in the one or more apertures to emit light through a front surface of the housing. A printed circuit board controls the LEDs, is mounted on a back surface of the housing, and includes one or more electrical conductors that supply power to the one or more LEDs. The one or more electrical conductors thermally couple directly with the housing such that more heat generated by the LEDs dissipates through the one or more electrical conductors into the housing as compared to dissipation through other thermal paths.

In an embodiment, a retrofit apparatus for a light fixture includes a printed circuit board having electrical conductors on its front-side, and one or more LEDs mounted with and powered through the one or more electrical conductors. A mounting bracket is configured for attaching to the light fixture, such that when the bracket attaches to the light fixture, heat generated by the one or more LEDs is primarily communicated from the LEDs through the one or more electrical conductors and the mounting bracket to the light fixture.

In an embodiment, an method of retrofitting a light fixture with LEDs includes mounting to the light fixture a printed circuit board having electrical conductors on a front-side thereof, and LEDs mounted with the electrical conductors on the printed circuit board front-side. The electrical conductors are in thermal contact with the light fixture. The LEDs emit light through apertures of the light fixture, and the electrical conductors and light fixture form a thermal path that dissipates more of the heat from the LEDs than other thermal paths.

In an embodiment, an method of retrofitting a light fixture with LEDs includes mounting a bracket in thermal contact with a housing of the light fixture. The bracket has a printed circuit board that has conductors on a frontside thereof and LEDs mounted with the conductors on the frontside. The bracket also has electronics mounted therewith, for supplying power to the LEDs. The conductors are in thermal contact with the bracket. The conductors and the bracket form a primary heat dissipation path from the LEDs to the housing.

In an embodiment, an LED based retrofit apparatus for a light fixture includes a bracket configured for attachment to the light fixture. Electronics mounted with the bracket convert AC line voltage power to low voltage DC power. A printed circuit board has one or more LEDs mounted thereon, and mounts with the bracket such that when the printed circuit board is supplied with the low voltage DC power, the LEDs primarily emit light upwardly into the light fixture, and the light reflects from one or more surfaces and exits the light fixture downwardly.

In an embodiment, an LED based lighting system, comprising one or more light bars, each of the one or more light bars having a plurality of LEDs mounted proximate to a bottom surface thereof. Each of the one or more light bars has a height to width aspect ratio of 3:1 to 6:1. Heat dissipation from the plurality of LEDs is dependent on the height to width aspect ratio.

BRIEF DESCRIPTION OF DRAWINGS

Embodiments herein may be understood by reference to the following detailed description, with reference to the drawings briefly described below.

FIG. 14 is a schematic cross-section of a light bar 730(1) that may be a component of an LED-based lighting system, in accord with an embodiment.

FIG. 15 depicts magnitude of heat transfer to ambient air at representative locations of light bars of varying aspect ratios, each such light bar having LED light and heat sources near a bottom thereof, in accord with an embodiment.

DETAILED DESCRIPTION OF DRAWINGS

In the following description, specific instances of elements may be described with reference subnumerals in parentheses (e.g., brackets 538(1), 538(2)) while elements that may be any of such individual elements may use numerals without subnumerals (e.g., brackets 538 may be any of brackets 538(1), 538(2)).

Figure 2:
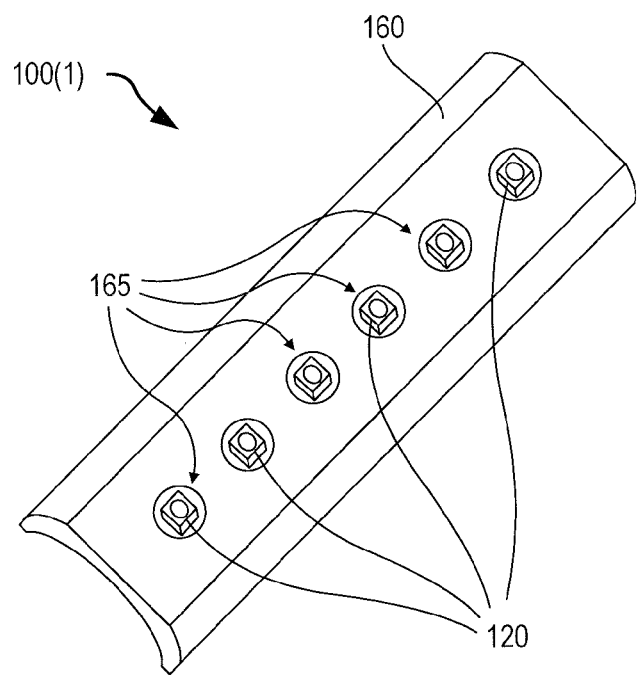
FIG. 2 shows an LED-based lighting system 100 in accord with an embodiment.

FIG. 2 shows an LED-based lighting system 100. System 100 includes a structural element 160 that provides structural support for a PCB (hidden by structural element 160 in the perspective of FIG. 2) on which LEDs 120 are mounted. Structural element 160 may be, for example, a metal rail that readily transfers heat from heat sources to a surrounding environment (e.g., air). Each LED 120 is centered within an aperture 165 formed by structural element 160 so that light emanates from each LED 120 and away from system 100 (not all LEDs 120 and apertures 165 are labeled in FIG. 2 for clarity of illustration). As used herein, the term "LED" includes light-emitting diodes and other devices based thereon, such as for example superluminous diodes and laser diodes.

Figure 3:
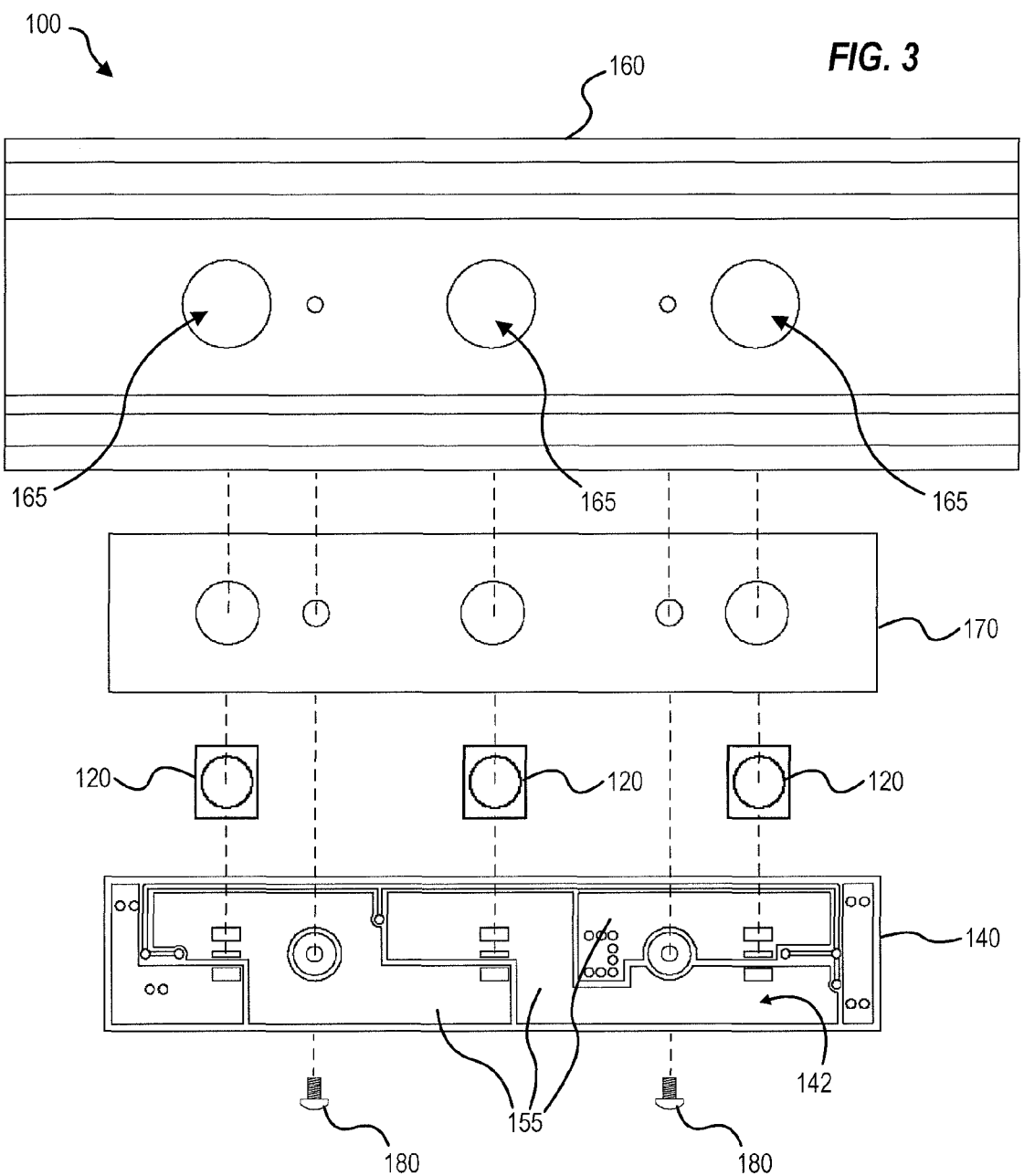
FIG. 3 shows an exploded view of a portion of LED-based lighting system of FIG. 2.

FIG. 3 shows an exploded view of a portion of LED-based lighting system 100. LEDs 120 mount to conductors 155 on a front-side 142 of a PCB 140, which may include a substrate of epoxy glass circuit board material (not all conductors 155 are labeled in FIG. 3 for clarity of illustration). A dielectric film 170 electrically isolates PCB 140 from structural element 160. Dielectric film 170 may optionally be absent if conductors 155 are otherwise isolated from structural element 160, for example when conductors 155 are covered by a solder mask layer (not shown). Alternatively, a structural element 160 formed of aluminum may be anodized to isolate PCB 140 from structural element 160. However, dielectric film 170 may be formed independently of a PCB or rail fabrication process, so that any shorting defects remaining after solder-mask or anodizing processes are insulated by dielectric film 170. Dielectric film 170 may be for example a 4 mil film of Kapton®, although other thicknesses may be utilized, and other dielectrics such as polyester may be utilized. Dielectric film 170 may also be more ductile than a solder mask layer or an anodized layer, so that it conforms to topology of PCB 140 to promote heat transfer between conductors 155 and structural element 160, while ensuring electrical isolation therebetween. In one embodiment, dielectric film 170 covers areas of PCB 140 where a solder mask layer is not present so that components are solderable to through-holes of PCB 140, and so that inclusions or irregularities in conductors 155 that the solder mask does not cover are insulated. Dielectric film 170 and/or a solder mask layer are advantageously thin enough so as not to significantly impede transfer of heat where conductors 155 face structural element 160 (that is, where conductors 155 are immediately adjacent to structural element 160 except for intervening solder mask and/or dielectric layers).

PCB 140 is fastened to structural element 160 using screws 180, or equivalent fasteners such as clips or nuts and bolts. Dashed lines show positions of screws 180 and LEDs 120 with respect to PCB 140 and structural element 160 in the exploded view of FIG. 3.

Conductors 155 are configured such that heat generated by LEDs 120 dissipates first into conductors 155 and then into structural element 160. Conductors 155 are formed of metal (e.g., copper) that may be thicker than required for electrical purposes alone, to facilitate heat transfer away from LEDs 120. That is, it is understood that "conductors" herein refers to materials and items formed thereof that are thermally conductive as well as electrically conductive. For example, standard PCBs may have conductor thicknesses of about 0.55-1.25 oz/ft$^2$ in order to accommodate typical current requirements, but conductors 155 may have conductor thicknesses of about 2.0-2.5 oz/ft$^2$ or more to facilitate this heat dissipation. Also, conductors 155 may be laid out on PCB 140 so as to occupy as much area of PCB 140 as possible. For example, conductors 155 may occupy more than 50%, 70% or even 95% of a surface area of front-side 142 of PCB 140. In the layout shown in FIG. 3, conductors 155 occupy about 74% of the front-side 142 area of PCB 140. Furthermore, the area of conductors 155 may be arranged so as to maximize area of conductors 155 that faces structural element 160 when assembled.

The thickness and large percentage of front-side PCB area occupied by conductors 155, and the proximity of conductors 155 to structural element 160, facilitate thermal coupling so that heat generated by LEDs 120 primarily dissipates through conductors 155 and structural element 160. That is, more heat generated by LEDs 120 dissipates through this heat dissipation path as compared to other thermal paths (e.g., through a back-side of PCB 140 to air or to other parts of a light fixture). When assembled to structural element 160, the large area of conductors 155 is separated from structural element 160 only by thin layers such as soldermask of PCB 140 and optional dielectric layer 170, so that such layers do not significantly impede heat transfer from conductors 155 to structural element 160.

In a thermal test of the configuration shown in FIG. 3, with LEDs 120 being ½ watt LEDs operated at the same test current as used to test system 10 (discussed above), a ΔT between metal leads of LEDs 120 and structural element 160 of 3 to 4 degrees Celsius was measured.

Use of epoxy glass as substrate material for PCB 140 may have certain advantages as compared to the metal core material used in PCB 40 of system 10. Epoxy glass PCBs are inexpensive, and are widely available from a large selection of suppliers, whereas metal core and ceramic PCBs are costly and are available from fewer suppliers. Inner layers can be readily incorporated into epoxy glass PCBs to facilitate electrical or thermal connections, but such layers currently cannot be incorporated into metal core PCBs. Epoxy glass PCBs are readily singulated (that is, separated into single PCBs during fabrication) whereas metal core and ceramic PCBs are more difficult to singulate. Rework of components mounted to epoxy glass PCBs is relatively easy, whereas rework of components mounted to metal core or ceramic PCBs is more difficult. Epoxy glass PCBs are lighter (per unit area) than metal core and ceramic PCBs.

Figure 1:
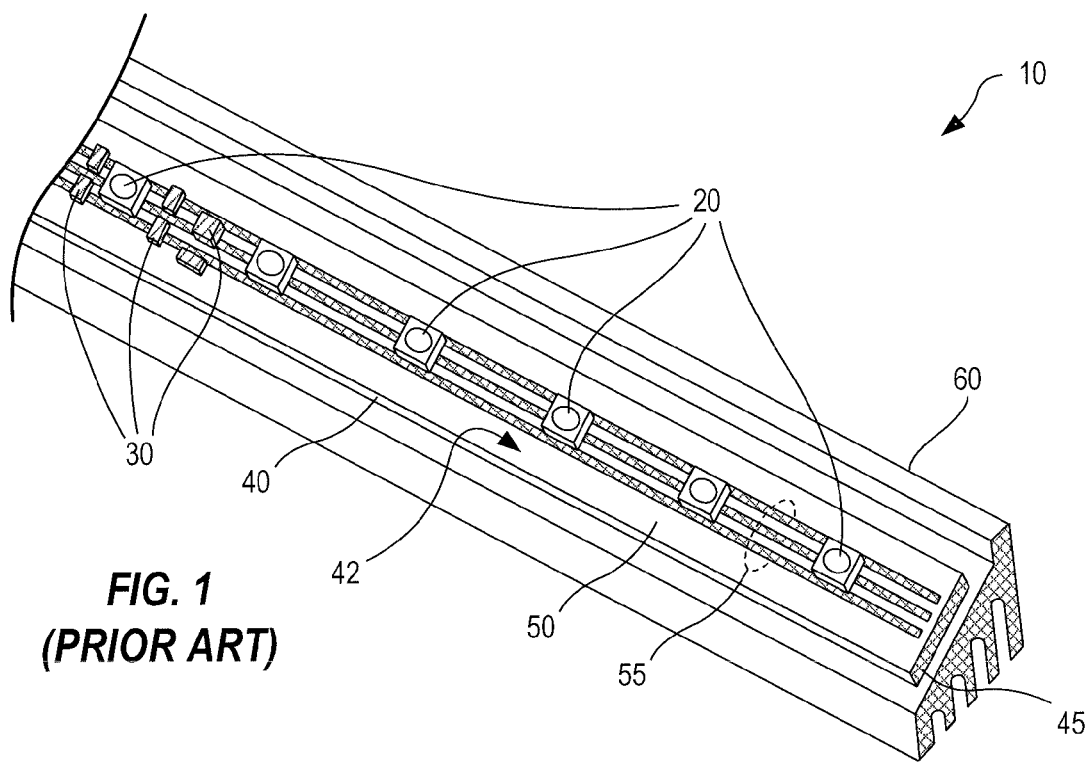
FIG. 1 shows a portion of a prior art LED-based lighting system.

Having LEDs 120 on front-side 142 of PCB 140, while components 130 are on back-side 144 (FIG. 4) may also provide certain advantages. For example, limiting the mounting of components 130 to back-side 144 facilitates a sleek appearance of system 100 wherein LEDs 120 emit light through structural element 160 while components 130 remain hidden from view. By comparison, prior art system 10 (FIG. 1) mounts components 30 along with LEDs 20 on front side 42 of PCB 40, necessitating extra structure if hiding components 30 from view is desired. Also, lack of non-LED components allows front-side 142 to present a planar surface except at LEDs 120; since LEDs 120 fit into apertures 165, the remaining planar surface of front-side 142 readily mounts to an inner surface of structural element 160, facilitating heat transfer. Furthermore, lenses, protective covers or other aesthetic or practical structure may optionally mount to structural element 160 with ease in the vicinity of LEDs 120, since structural element 160 presents an easily used substrate for mounting of such structure. Mounting similar extra structure to system 10 is more difficult since all of conductors 55, LEDs 20 and components 30 compete for space on the same front side 42 of PCB 40.

Figure 4:
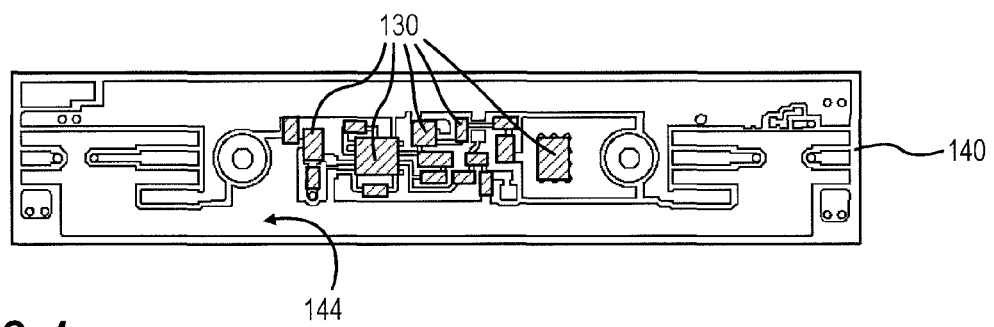
FIG. 4 shows a back side of a PCB of the system of FIG. 3, with components mounted thereto.

FIG. 4 shows a back-side 144 of PCB 140 with components 130 mounted thereto (not all components 130 are labeled in FIG. 4, for clarity of illustration). System 100 (FIG. 3) dissipates more power as heat through LEDs 120 than through components 130, such that thermal management of components 130 is not as critical to reliability of system 100.

Figure 5:
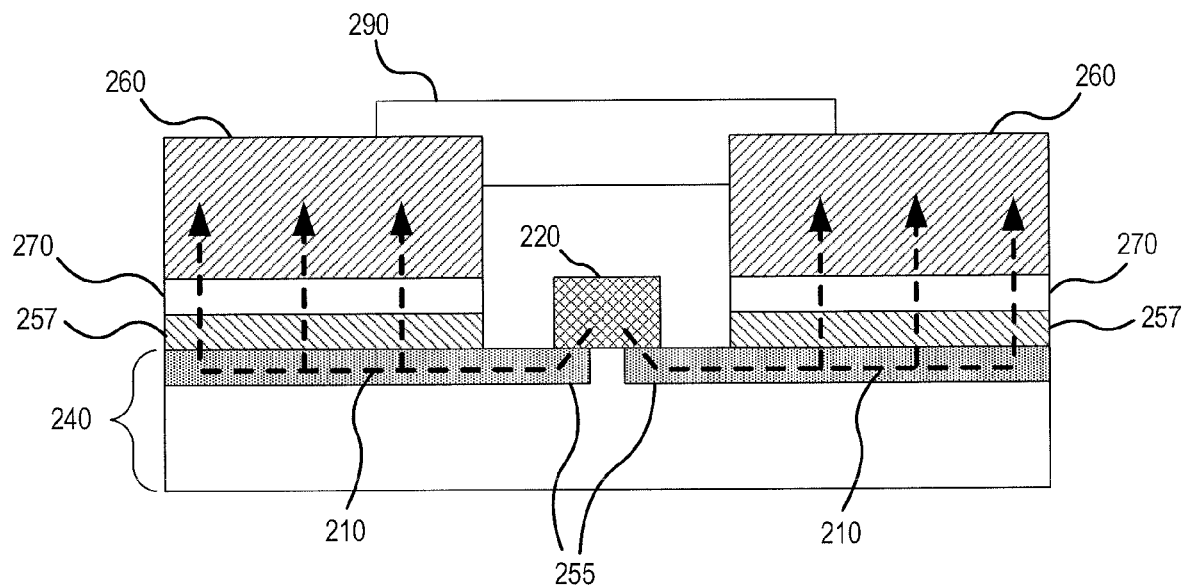
FIG. 5 is a schematic cross-section showing primary heat dissipation for an LED-based lighting system, in accord with an embodiment.

FIG. 5 is a schematic cross-section showing primary heat dissipation paths 210 for an LED-based lighting system 200. System 200 includes a PCB 240 having conductors 255 that are at least partially covered by a solder mask layer 257. A dielectric layer 270 provides additional electrical isolation between PCB 240 and a structural element 260, but does not significantly impede thermal transfer therebetween. An LED 220 emits light that passes through an optional lens 290.

A PCB may include structure for conducting heat from a front side to a back side of the PCB, to further improve heat dissipation from the LEDs. For example, the PCB may include vias filled with metal to facilitate heat transfer from a front-side to a back-side of the PCB, as now discussed in FIG. 6.

Figure 6:
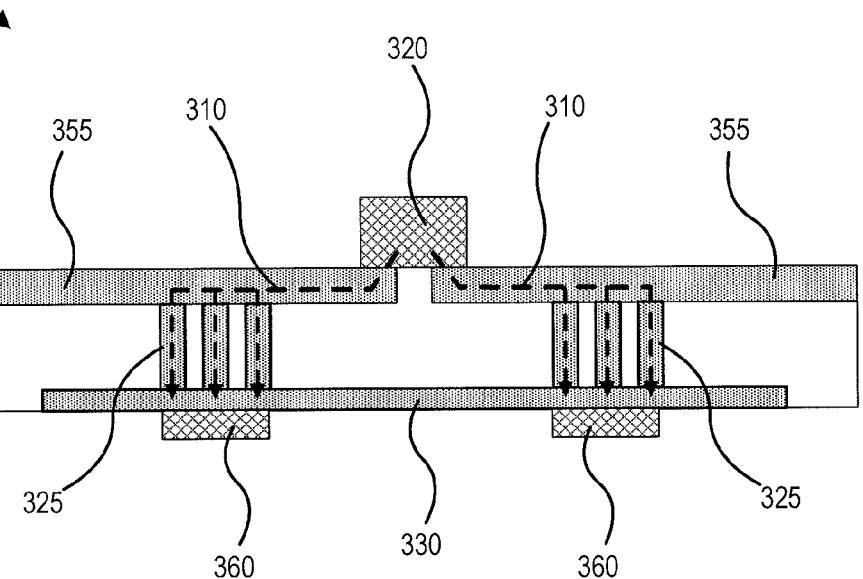
FIG. 6 is a schematic cross-section showing primary heat dissipation for another LED-based lighting system, in accord with an embodiment.

FIG. 6 is a schematic cross-section showing primary heat dissipation paths 310 for an LED-based lighting system 300. System 300 includes a PCB 340 having conductors 355. An LED 320 emits light and generates heat that passes into conductors 355. Metal-filled vias 325 facilitate heat transfer from conductors 355 to back-side conductors 330 (not all vias 325 are labeled in FIG. 6 for clarity of illustration). Metal-filled vias 325 may be formed at the time of PCB fabrication—for example, as vias that are through-hole plated—or may be formed after fabrication—for example, by filling holes of PCB 340 with solder, or mechanically by inserting or screwing metal rods or screws through PCB 340. Back-side conductors 330 may dissipate heat into a surrounding medium (e.g., air) directly. Alternatively, conductors 330 may facilitate heat transfer to optional heat sinks 360, which may include passive structures (e.g., radiating structures) and/or active devices (e.g., fans).

The above description of thermal dissipation paths for LED-based lighting systems thus provide one set of methods for generating thermal dissipation paths. Such methods include specifying PCB conductors that are thicker than required to supply current to the LEDs and that occupy 50% or more of PCB area, and configuring the conductors in close proximity to structural elements so as to dissipate heat away from the LEDs. Further methods for generating thermal dissipation paths include utilizing different structural elements to conduct heat away from LEDs, and to encourage convective cooling, as described below.

Figure 7:
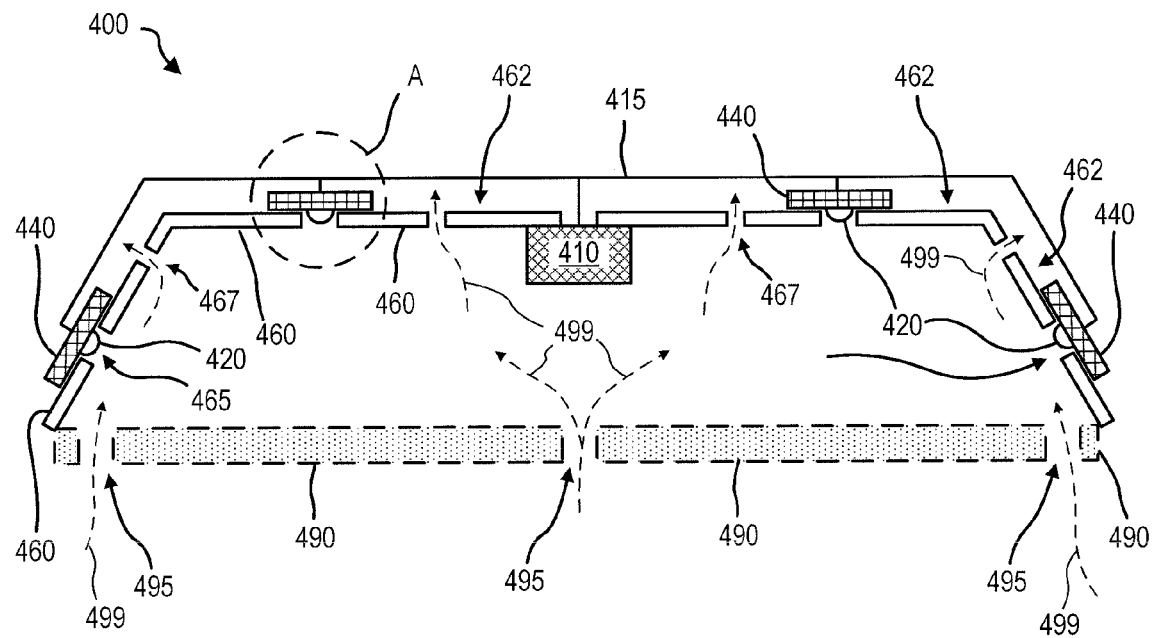
FIG. 7 is a schematic cross-section of a troffer type LED-based lighting system, in accord with an embodiment.

FIG. 7 is a schematic cross-section of a troffer type LED-based lighting system 400. System 400 includes a troffer housing 460 and an optional diffuser 490. Electronics 410 form a power supply for LEDs (e.g., by converting incoming AC line voltage power to low voltage DC power, and optionally controlling dimming of the LEDs) and connect to PCBs 440 through wiring 415 (wiring 415 is shown schematically as a single line, but may include multiple wires). LEDs 420 mount with PCBs 440, which respectively mount with an outer surface 462 of housing 460. In use, LEDs 420 project light through apertures 465 of housing 460. (Apertures 465 are shown in FIG. 7 as interruptions in housing 460, but housing 460 may connect about apertures 465 outside the cross-sectional plane shown in FIG. 7.)

PCBs 440 are in intimate thermal contact with troffer housing 460 to provide effective conduction of heat away from LEDs 420 and into housing 460, as discussed below in connection with FIG. 8. Additionally, housing 460 may form optional vent apertures 467, and optional diffuser 490 may form optional vent apertures 495. Vent apertures 467 and/or 495 encourage convection of ambient air through system 400, such as a flow represented by arrows 499, for convective cooling of housing 460. Details of a region denoted by A in FIG. 7 are shown in FIG. 8.

Figure 8:
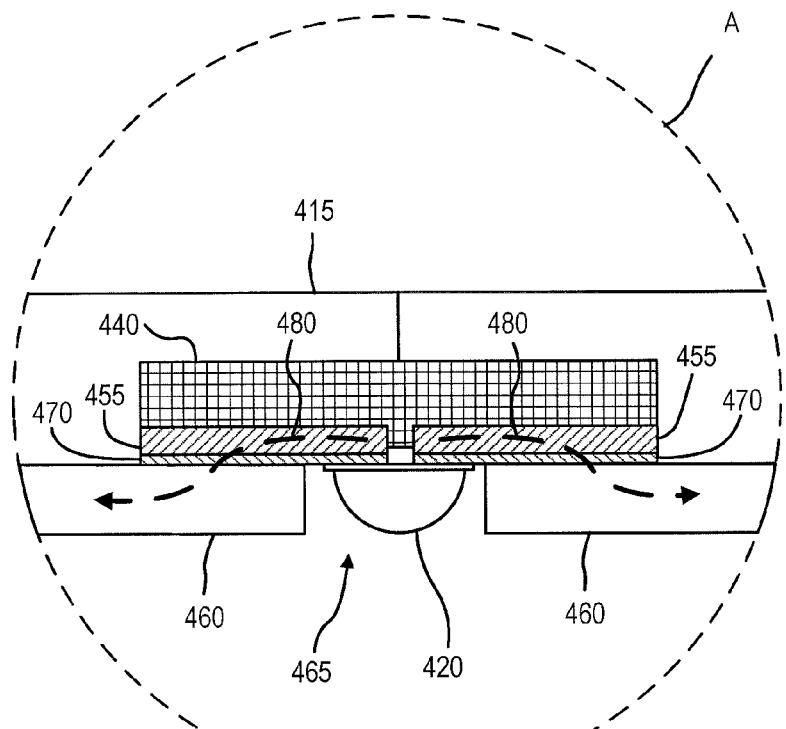
FIG. 8 shows details of one region the troffer type LED-based lighting system of FIG. 7, in accord with an embodiment.

It is appreciated that the number and location of elements shown in FIG. 7 and FIG. 8 may differ from those shown. For example, LEDs 420 and their associated PCBs 440 and apertures 465 may be entirely in a top surface of housing 460, rather than on both the top surface and side surfaces, as shown. Vent apertures 467 and/or 495 may vary in placement and number. Electronics 430 may mount at other locations on housing 460 than the location shown, or may be remote from housing 460 (e.g., one set of electronics may connect to several systems 400 with wiring 415).

FIG. 8 shows details of region A of FIG. 7. PCB 440 includes conductors 455 that make electrical and thermal contact with LED 420, and which facilitate heat transfer from LED 420 to housing 460 along paths 480. Conductors 455 may be thicker than required for electrical purposes alone, to facilitate the heat transfer. A dielectric layer 470 (e.g., a solder mask layer) electrically isolates housing 460 from conductors 455, but does not significantly impede thermal transfer therebetween.

Figure 9A:
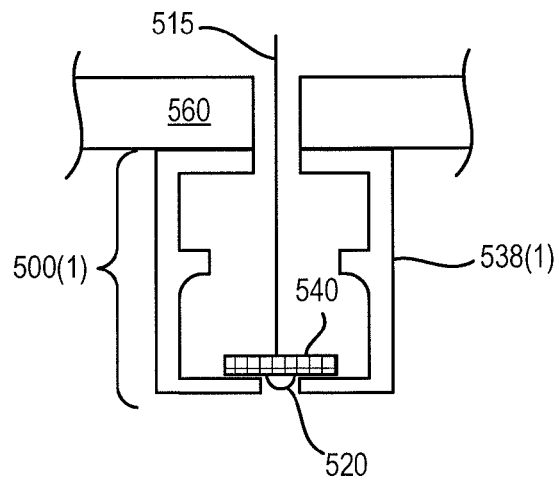
FIG. 9 is a schematic cross-section of a retrofit apparatus mounted with a portion of a housing, in accord with an embodiment.

FIG. 9A is a schematic cross-section of a retrofit apparatus 500(1) mounted with a portion of a housing 560. Retrofit apparatus 500(1) includes a thermally conductive mounting bracket 538(1). In one embodiment, thermally conductive mounting bracket 538(1) supports a PCB 540 with LEDs 520. Bracket 538(1) mounts with housing 560 and may be located proximate a location intended for a fluorescent bulb. Bracket 538(1) provides a relatively large area of thermal contact with housing 560. Bracket 538(1) may be a unitary bracket, or bracket 538(1) may be provided in segments. Bracket 538(1) may be fixed when connecting system 500(1) with housing 560(1), or bracket 538(1) may include rotating or sliding segments that move relative to one another to allow a user or a motor to tilt apparatus 500(1), for example to direct output light. Bracket 538(1) thus provides a thermal path from LEDs 520 to housing 560, for example via thermal contact with conductors of PCB 540. Wiring 515 (shown schematically as a single line, but understood to include one or more wires) facilitates connection between PCB 540 and an external power source, such as a wall socket or battery.

Figure 9B:
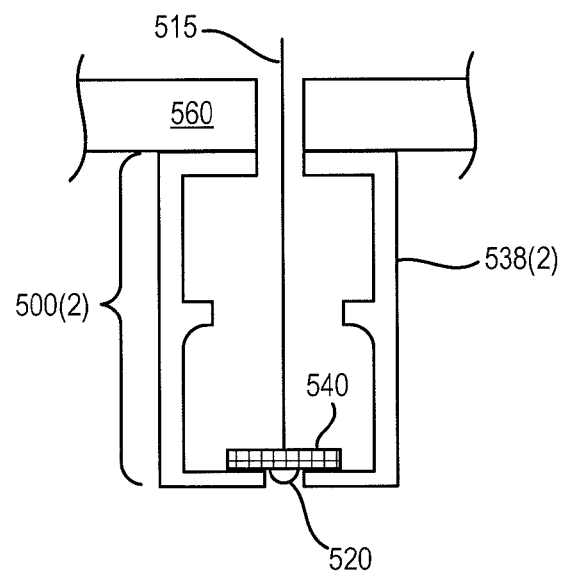
Figure 9C:
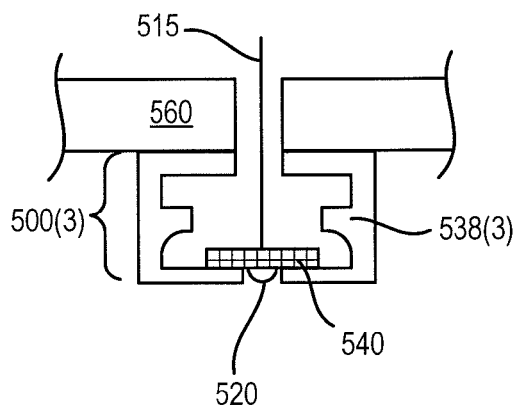

It is contemplated that mounting bracket for a retrofit system may have physical dimensions that enable certain types of light fixtures to be retrofitted therewith, and/or that produce certain results or visual effects when used. For example, FIG. 9B is a schematic cross-section of a retrofit apparatus 500(2) mounted with a portion of housing 560. Retrofit apparatus 500(2) includes a thermally conductive mounting bracket 538(2) that is substantially similar to bracket 538(1) (FIG. 9A) except that bracket 538(2) is longer in a vertical direction, thereby allowing use with a deeper housing 560, or bringing LED 520 further down within housing 560 (e.g., see FIG. 10B). FIG. 9C is a schematic cross-section of a retrofit apparatus 500(3) mounted with a portion of housing 560. Retrofit apparatus 500(3) includes a thermally conductive mounting bracket 538(3) that is substantially similar to bracket 538(1) (FIG. 9A) except that bracket 538(2) is more compact in a vertical direction, and thus may be suitable for a lower profile housing 560 (e.g., see FIG. 10C).

The thermal coupling provided by brackets 538 enables superior performance of lighting systems that utilize any of retrofit apparatuses 500 (e.g., apparatuses 500(1)-(3) shown in FIGS. 9A-9C), by providing for operation of LEDs 520 at a low operating temperature, which leads to high efficiency operation. Furthermore, a retrofit apparatus 500 can be retrofitted into existing housings 560, as described in connection with FIGS. 10A-10C below. In one embodiment, bracket 538 and the components mounted thereon, along with a power supply and a connector to wiring 515, are provided as a retrofit apparatus for easy installation with an existing fluorescent fixture. Bracket 538 fits with an existing housing 560 via mechanical fasteners such as screws, pegs, clips, one or more braces or other known fasteners (not shown) or may utilize such fasteners as magnets or adhesives, that fix or brace bracket 538 with housing 560. In one aspect, these fasteners work with bracket 538 to hold apparatus 500 firmly in place, yet allow for removal of apparatus 500 for service (if necessary) or if a substitute apparatus 500 is desired. Magnets integrated with bracket 538 may be a particularly useful choice for connecting bracket 538 with housing 560. For example, many magnets are good thermal conductors, and can be utilized as part of a primary thermal dissipation path. Also, in certain embodiments magnets may support bracket 538 without fixing its position with respect to housing 560, such that bracket 538 may be repositioned without drilling holes, applying adhesive or otherwise altering bracket 538 or housing 560 in a manner that would be difficult to undo.

Bracket 538 may be coated with or otherwise incorporate a highly conductive material or combination of materials. In one embodiment, bracket 538 is made with copper. In another embodiment, bracket 538 includes a copper/diamond combination. In still another embodiment, bracket 538 includes aluminum, magnesium, and/or alloys thereof. Further exemplary materials that may be incorporated in bracket 538 include (but are not limited to) those listed below in Tables 1-3.

TABLE 1

First Generation Thermal Management Materials

| Reinforcement | Matrix | Thermal Conductivity k (W/m-K) | CTE (ppm/K) | Density (g/cm$^3$) | Specific Thermal Conductivity (W/m-K) |
|---|---|---|---|---|---|
| — | Aluminum | 218 | 23 | 2.7 | 81 |
| — | Copper | 400 | 17 | 8.9 | 45 |
| — | Invar | 11 | 1.3 | 8.1 | 1.4 |
| — | Kovar | 17 | 5.9 | 8.3 | 2.0 |
| — | Cu/I/Cu | 164 | 8.4 | 8.4 | 20 |
| — | Cu/Mo/Cu | 182 | 6.0 | 9.9 | 18 |
| — | Cu/Mo—Cu/Cu | 245 to 280 | 6 to 10 | 9.4 | 26 to 30 |
| — | Titanium | 7.2 | 9.5 | 4.4 | 1.6 |
| Copper | Tungsten | 157 to 190 | 5.7 to 8.3 | 15 to 17 | 9 to 13 |

TABLE 1-continued

First Generation Thermal Management Materials

| Reinforcement | Matrix | Thermal Conductivity k (W/m-K) | CTE (ppm/K) | Density (g/cm$^3$) | Specific Thermal Conductivity (W/m-K) |
|---|---|---|---|---|---|
| Copper | Molybdenum | 184 to 197 | 7.0 to 7.1 | 9.9 to 10.0 | 18 to 20 |
| — | Solder - Sn63/Pb37 | 50 | 25 | 8.4 | 6.0 |
| — | Epoxy | 1.7 | 54 | 1.2 | 1.4 |
| E-glass Fibers | Epoxy | 0.16 to 0.26 | 11 to 20 | 2.1 | 0.1 |

Properties of traditional first-generation thermal management materials.

From: Zweben, Carl, "Thermal Materials Solve Power Electronics Challenges," Feb. 1, 2006, available at: http://powerelectronics.com/thermal_management/heatpipes_spreaders/power_thermal_materials_solve/

TABLE 2

Second Generation High-Performance Thermal Materials

| Reinforcement | Matrix | Inplane Thermal Conductivity (W/m-K) | Through-Thickness Thermal Conductivity (W/m-K) | Inplane CTE (ppm/K) | Density (g/cm$^3$) | Specific Inplane Thermal Conductivity (W/m-K) |
|---|---|---|---|---|---|---|
| Natural Graphite | Epoxy | 370 | 6.5 | −2.4 | 1.94 | 190 |
| Continuous Carbon Fibers | Polymer | 330 | 10 | −1 | 1.8 | 183 |
| Discontinuous Carbon Fibers | Copper | 300 | 200 | 6.5 to 9.5 | 6.8 | 44 |
| SiC Particles | Copper | 320 | 320 | 7 to 10.9 | 6.6 | 48 |
| Continuous Carbon Fibers | SiC | 370 | 38 | 2.5 | 2.2 | 170 |
| Carbon Foam | Copper | 350 | 350 | 7.4 | 5.7 | 61 |

Properties of advanced second-generation thermal management materials with high thermal conductivities and low coefficients of thermal expansion ($300 \leq k < 400$).
From: Zweben, Carl, "Thermal Materials Solve Power Electronics Challenges," cited above

TABLE 3

Third Generation High-Performance Thermal Materials

| Reinforcement | Matrix | Inplane Thermal Conductivity (W/m-K) | Through-Thickness Thermal Conductivity (W/m-K) | Inplane CTE (ppm/K) | Density (g/cm$^3$) | Specific Inplane Thermal Conductivity (W/m-K) |
|---|---|---|---|---|---|---|
| — | CVD Diamond | 1100 to 1800 | 1100 to 1800 | 1 to 2 | 3.52 | 310 to 510 |
| — | HOPG | 1300 to 1700 | 10 to 25 | −1.0 | 2.3 | 565 to 740 |
| — | Natural Graphite | 150 to 500 | 6 to 10 | — | — | — |
| Continuous Carbon Fibers | Copper | 400 to 420 | 200 | 0.5 to 16 | 5.3 to 8.2 | 49 to 79 |
| Continuous Carbon Fibers | Carbon | 400 | 40 | −1.0 | 1.9 | 210 |
| Graphite Flake | Aluminum | 400 to 600 | 80-110 | 4.5 to 5.0 | 2.3 | 174 to 260 |
| Diamond Particles | Aluminum | 550 to 600 | 550 to 600 | 7.0 to 7.5 | 3.1 | 177 to 194 |
| Diamond and SiC Particles | Aluminum | 575 | 575 | 5.5 | — | — |
| Diamond Particles | Copper | 600 to 1200 | 600 to 1200 | 5.8 | 5.9 | 102 to 203 |
| Diamond Particles | Cobalt | >600 | >600 | 3.0 | 4.12 | >145 |
| Diamond Particles | Silver | 400 to >600 | 400 to >600 | 5.8 | 5.8 | 69 to >103 |
| Diamond Particles | Magnesium | 550 | 550 | 8 | — | — |

TABLE 3-continued

Third Generation High-Performance Thermal Materials

| Reinforcement | Matrix | Inplane Thermal Conductivity (W/m-K) | Through-Thickness Thermal Conductivity (W/m-K) | Inplane CTE (ppm/K) | Density (g/cm$^3$) | Specific Inplane Thermal Conductivity (W/m-K) |
|---|---|---|---|---|---|---|
| Diamond Particles | Silicon | 525 | 525 | 4.5 | — | — |
| Diamond Particles | SiC | 600 | 600 | 1.8 | 3.3 | 182 |

Properties of advanced third-generation thermal management materials with ultrahigh thermal conductivities and low coefficients of thermal expansion (k ≧ 400).
From: Zweben, Carl, "Thermal Materials Solve Power Electronics Challenges," cited above Materials listed in Tables 1-3 may, for example, be extruded to form bracket 538, such that PCB 540 spans a length of the extrusion and incorporates any number of LEDs 520.

Figure 10A:
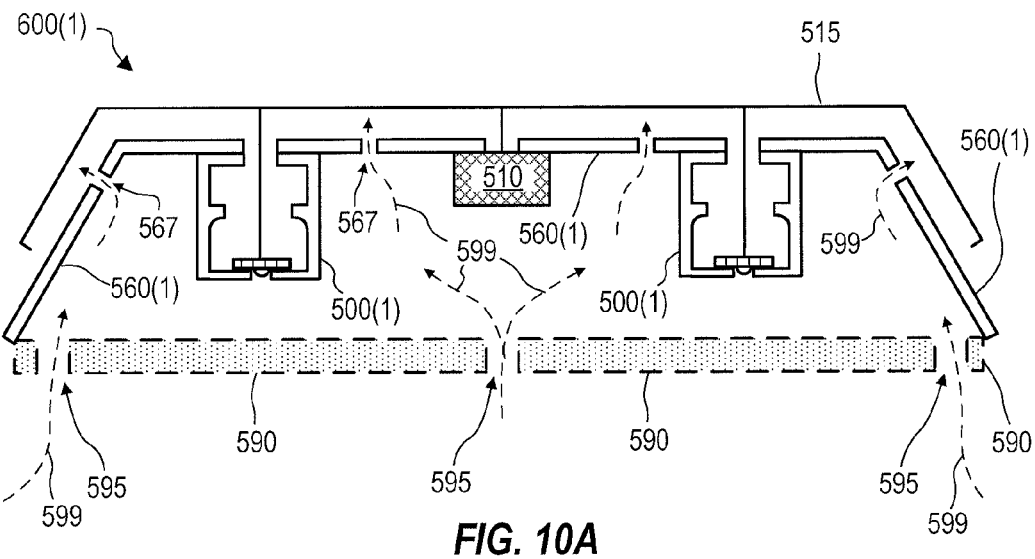
FIG. 10 is a schematic cross-section of an LED-based lighting system that includes two of the retrofit apparatuses of FIG. 9, retrofitted into an existing housing, in accord with an embodiment.

FIG. 10A is a schematic cross-section of an LED-based lighting system 600(1) that includes two apparatuses 500(1) (FIG. 9A) retrofitted into an existing housing 560(1). System 600(1) includes electronics 510 that connect with wiring 515 of apparatuses 500(1), as shown. Electronics 510 form a power supply for LEDs (e.g., by converting incoming AC line voltage power to low voltage DC power, and optionally controlling dimming of the LEDs). Apparatuses 500(1) are in intimate thermal contact with housing 560(1) to provide effective conduction of heat away from LEDs 520 (see FIG. 9A). Heat generated by LEDs 520 passes into thermally conductive PCB layers in PCB 540 (FIG. 9A, heat travels in the same manner as illustrated in FIG. 8), then to bracket 538(1) (FIG. 9A) and to housing 560(1).

To further facilitate heat transfer away from LEDs 520, housing 560(1) may form optional vent apertures 567, and an optional diffuser 590 may form optional vent apertures 595. Vent apertures 567 and/or 595 encourage convection of ambient air through system 600(1), such as flows represented by arrows 599, for convective cooling of housing 560. Vent apertures 567 may be part of an original configuration of housing 560(1), or they may be added (e.g., by drilling or punching) when apparatuses 500(1) are retrofitted into housing 560(1). Similarly, vent apertures 595 may be part of an original configuration of the lighting system before apparatuses 500(1) are retrofitted, or apertures 595 may be added at the time of retrofitting apparatuses 500(1), or retrofitting may include installing a diffuser 590 that was not previously present.

Figure 10B:
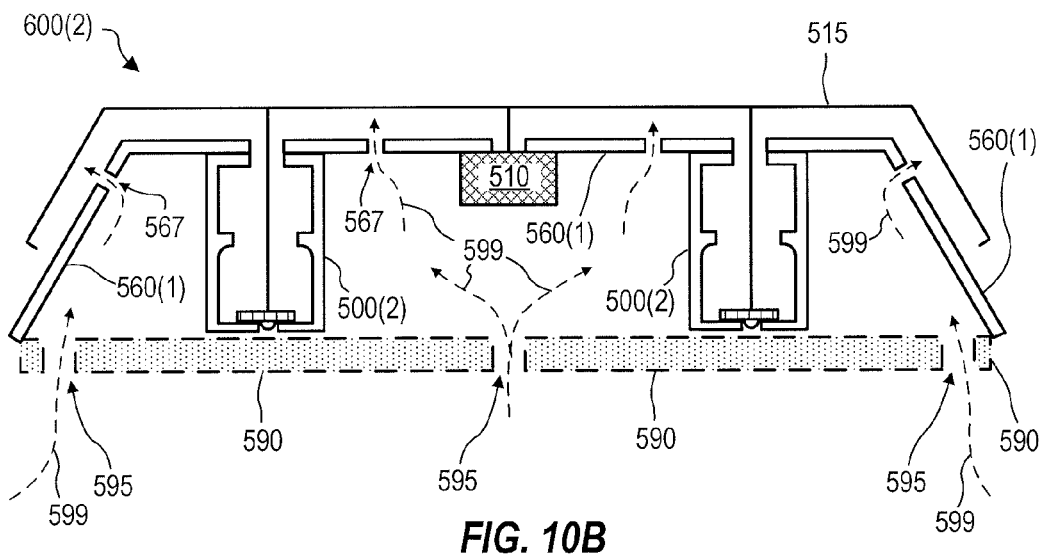

FIG. 10B is a schematic cross-section of an LED-based lighting system 600(2) that includes two apparatuses 500(2) (FIG. 9B) retrofitted into existing housing 560(1) (e.g., having the same dimensions as housing 560(1) of FIG. 10A). Apparatuses 500(2) utilize brackets 538(2) (FIG. 9B) that are taller in a vertical direction than brackets 538(1) (FIG. 9A) such that for housing 560(1), LEDs 520 (FIG. 9B) are closer to diffuser 590 than when apparatuses 500(1) are used.

Figure 10C:
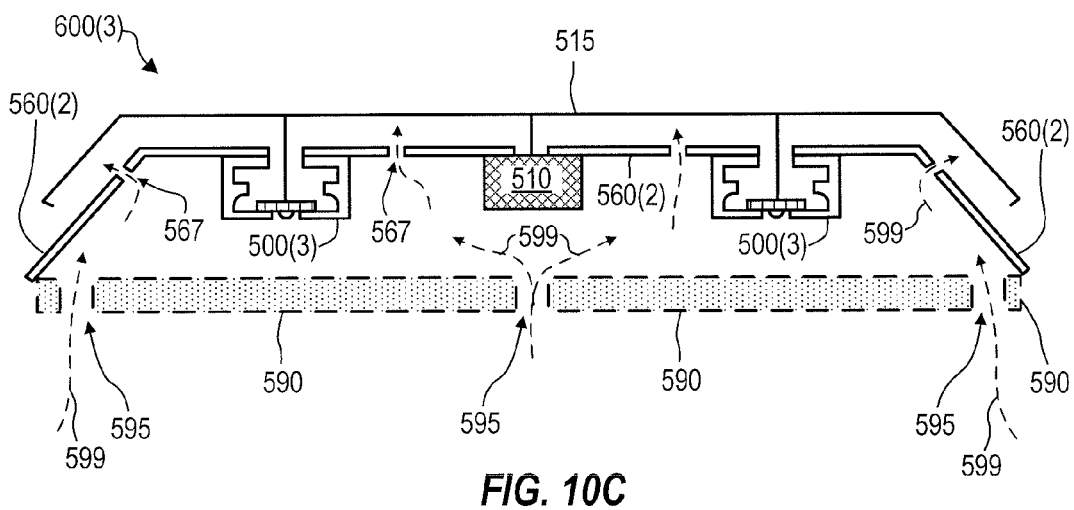

FIG. 10C is a schematic cross-section of an LED-based lighting system 600(3) that includes two apparatuses 500(3) (FIG. 9C) retrofitted into a low profile housing 560(2). As compared with apparatuses 500(1) and 500(2), vertically compact apparatuses 500(3) are retrofittable into low profile housing 560(2) to form system 600(3) that may be advantageously used, for example in applications where limited vertical space is available for a lighting system. Alternatively, apparatuses 500(3) may be utilized in a relatively deep housing, in order to provide a significant space between LEDs 520 and a diffuser of the system.

Figure 11A:
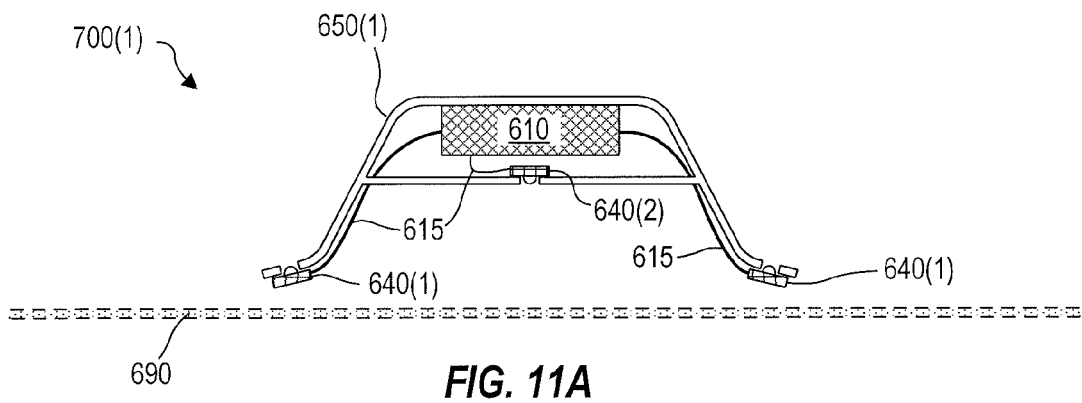
FIG. 11A is a schematic cross-section of a retrofit apparatus that may be retrofitted to an existing housing, in accord with an embodiment.

FIG. 11A is a schematic cross-section of a retrofit apparatus 700(1) that may be retrofitted to an existing housing (e.g., a troffer). Retrofit apparatus 700(1) includes a thermally conductive bracket 650(1) configured for mounting to the housing, that provides both structural support and an efficient thermal dissipation path for LED based lighting mounted thereon. Bracket 650(1) supports electronics 610 and PCBs 640 that emit light from LEDs thereon (the LEDs are not individually labeled in FIG. 11A, for clarity of illustration, but are mounted with PCBs 640 in like manner as shown in FIG. 8). Electronics 610 form a power supply for LEDs (e.g., by converting incoming AC line voltage power to low voltage DC power, and optionally controlling dimming of the LEDs). Bracket 650(1) may be formed, for example, of aluminum, magnesium, copper, alloys thereof and/or any of the materials listed in Tables 1-3 above. PCBs 640 may be strips that mount along a length of element 650(1) (e.g., in and out of the plane of the page where the cross-section is taken) such that each PCB 640 may include multiple LEDs thereon. Two PCBs 640(1) direct light upwardly that is diffused or reflected from the existing housing to exit downwardly therefrom, while a PCB 640(2) directs light downwardly; a collective effect of the light from PCBs 640(1) and 640(2) is therefore one of "direct/indirect" lighting. Wiring 615 transmits electrical power from electronics 610 to each PCB 640. An optional diffuser 690, through which the LED light passes before it exits the light fixture, may be included in retrofit apparatus 700(1) along with element 650(1) and the electronics and PCBs mounted thereon. Retrofit apparatus 700(1) may be advantageous for retrofitting light fixtures because the necessary electronics that provide power to LEDs, and the LEDs themselves, are physically integrated into a single unit, providing for simpler field retrofits as compared to apparatuses that require installing multiple components.

Figure 11B:
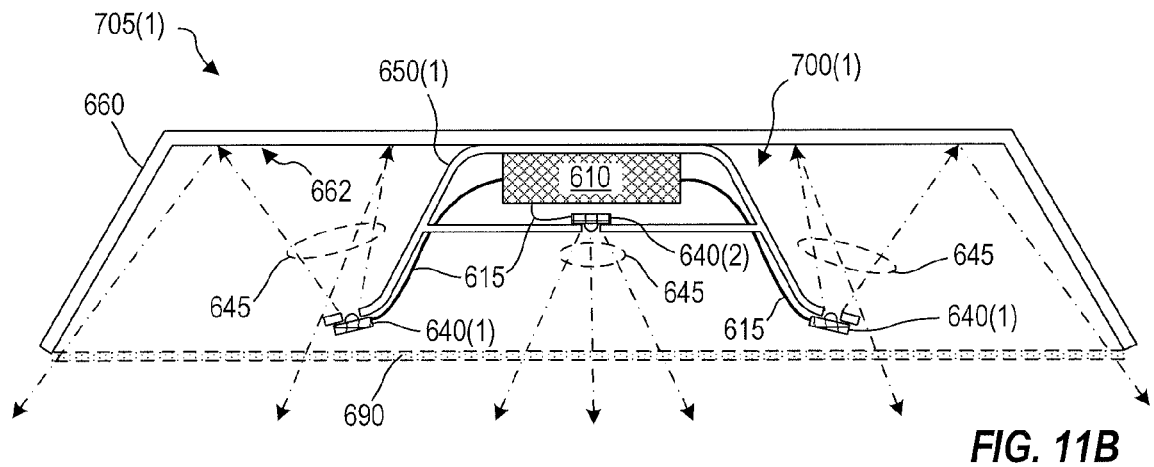
FIG. 11B shows a light fixture in which a housing has been retrofit with the retrofit apparatus of FIG. 11A.

FIG. 11B shows a light fixture 705(1) in which a housing 660 has been retrofit with retrofit apparatus 700(1). Housing 660 may be, for example, a troffer. LEDs associated with each PCB 640 emit light designated by light rays 645. PCBs 640(1) are mounted such that light rays 645 are directed upwardly towards housing 660, where they impinge on an inner surface 662 of housing 660. Surface 662 may be reflective or coated with a reflective color (e.g., white) so that light from the outwardly facing PCBs is efficiently reflected downwards from housing 660. PCB 640(2) that is approximately central within housing 600 directs light rays 645 downwardly. Optional diffuser 690 may be utilized to help blend and diffuse light generated by the LEDs (e.g., to minimize user discomfort and/or distraction that may be associated with LEDs that are bright point sources of light). Bracket 650(1) may form a primary thermal path for conducting heat generated by the LEDs, away from PCBs 640 to housing 660.

Figure 11C:
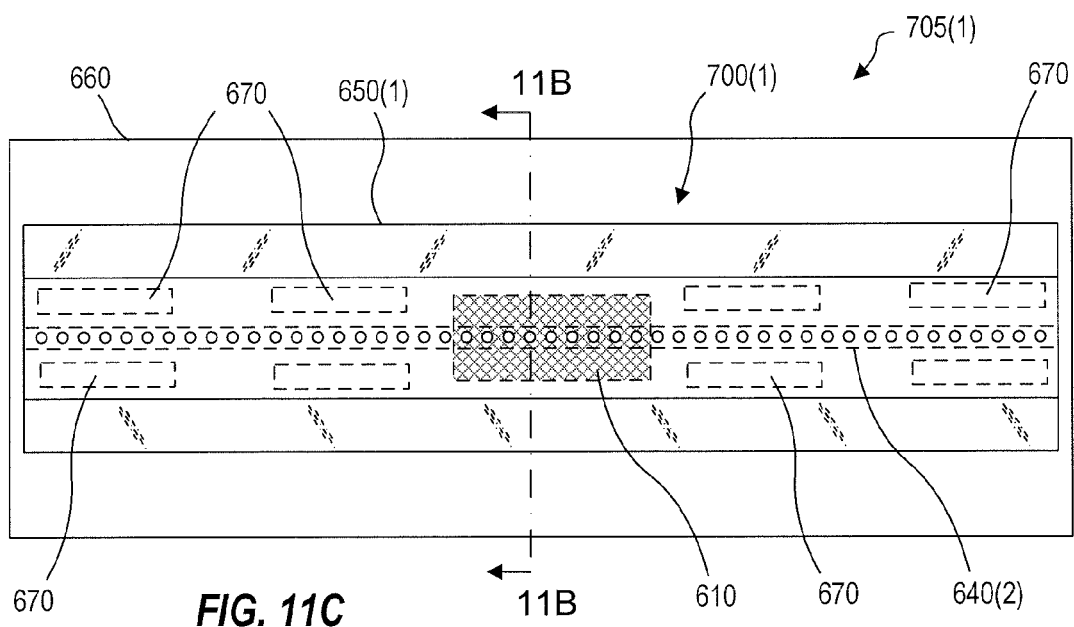
FIG. 11C shows a bottom view of the light fixture of FIG. 11B, to further illustrate mounting hardware utilized in attaching the retrofit apparatus of FIG. 11B with a housing.

FIG. 11C shows a bottom view of light fixture 705(1) of FIG. 11B, to further illustrate mounting hardware utilized in attaching retrofit apparatus 700(1) with housing 660. Dashed line 11B-11B indicates the cross-section along which the view of FIG. 11B is taken. Electronics 610 are shown in dashed outline, as they are hidden within bracket 650(1) in the view of FIG. 11C. Also shown in dashed outline are eight fasteners 670 that attach bracket 650(1) with housing 660. As noted above, fasteners such as mechanical fasteners, magnets and/or adhesives may be utilized as fasteners 670. Fasteners 670 may include slots or tabs of bracket 650(1) and/or housing 660 that mate with one another. Fasteners 670 may advantageously facilitate heat dissipation from bracket 650(1) to housing 660. Also, although eight fasteners 670 are shown, it is contemplated that other numbers and arrangements of fasteners may be utilized in embodiments.

Figure 12A:
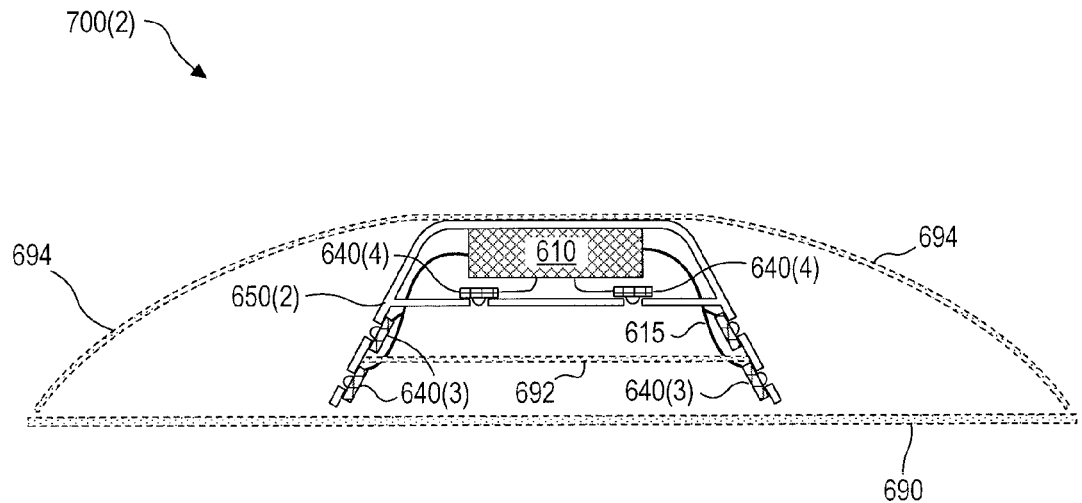
FIG. 12A is a schematic cross-section of a retrofit apparatus that may be retrofitted to an existing housing, in accord with an embodiment.

It is contemplated that a unitary retrofit apparatus may be configured with differing numbers, types and/or arrangements of LEDs, and differing diffuser configurations, than are shown in FIG. 11A and FIG. 11B. For example, FIG. 12A is a schematic cross-section of a retrofit apparatus 700(2) that may be retrofitted to an existing housing. Retrofit apparatus 700(2) includes a thermally conductive bracket 650(2) configured for mounting to the housing, that provides both structural support and an efficient thermal dissipation path for LED based lighting mounted thereon. Bracket 650(2) supports electronics 610 and PCBs 640 that emit light from LEDs thereon (the LEDs are not individually labeled in FIG. 11B, for clarity of illustration, but each PCB 640 includes multiple LEDS that are mounted with PCBs 640 in like manner as shown in FIG. 8). Bracket 650(2) may be formed, for example, of aluminum, magnesium, copper, alloys thereof and/or any of the materials listed in Tables 1-3 above. In retrofit apparatus 700(2), PCBs 640(3) mount in pairs along upwardly facing sides of element 650(2) (e.g., the strips extend in and out of the plane of the page where the cross-section is taken, as illustrated in FIG. 11C) and a pair of PCB 640(4) mounts downwardly, as shown, to create an effect of "direct/indirect" lighting. Wiring 615 transmits electrical power from electronics 610 to each PCB 640. Optional diffusers 690, 692 and 694 may be included in retrofit apparatus 700(1) along with element 650(2) and the electronics and PCBs mounted thereon. Optional diffuser 694 is shown as a concave, downwardly facing element that primarily reflects and may also diffuse light emitted from LEDs of PCBs 640 (3). Diffuser 694 is shown extending across a top surface of bracket 650(2) but is configured for minimal thermal impedance between element 650(2) and a housing. For example, diffuser 694 may have open areas that allow direct contact between element 650(2) and a housing, or may be very thin, or may be provided in sections that attach to sides of element 650(2) but do not extend between element 650(2) and the housing. Like retrofit apparatus 700(1), retrofit apparatus 700 (2) may be advantageous for retrofitting light fixtures because the necessary electronics that provide power to LEDs, the LEDs themselves, and optional diffusers may be physically integrated into a single unit, providing for simpler field retrofits as compared to apparatuses that require installing multiple components.

Figure 12B:
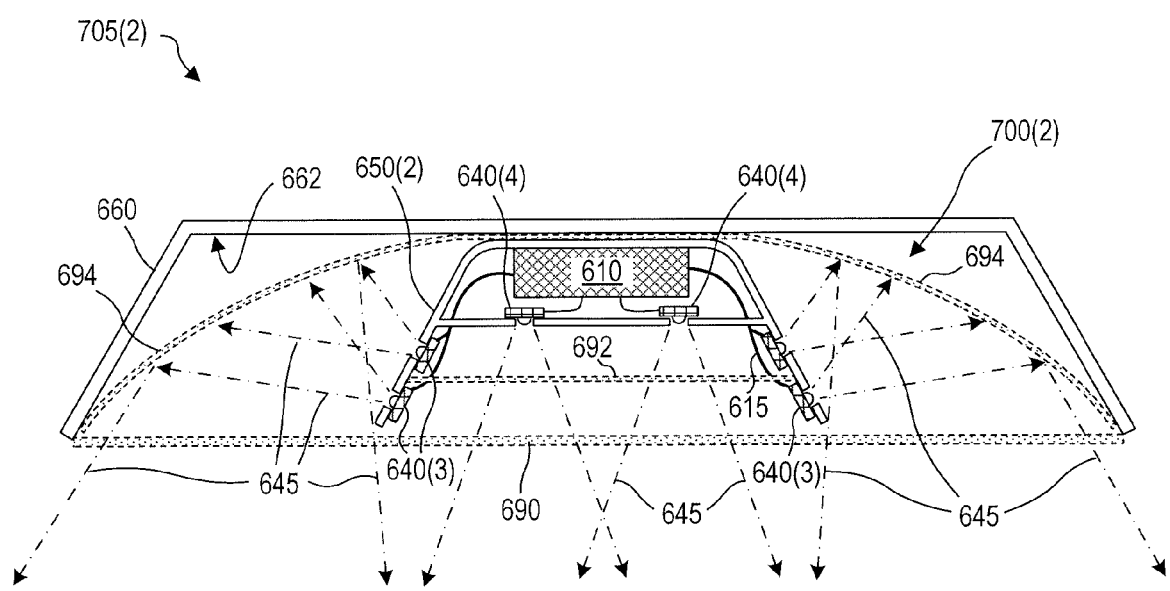
FIG. 12B shows a light fixture in which a housing has been retrofit with the retrofit apparatus of FIG. 12A.

FIG. 12B shows a light fixture 705(2) in which housing 660 has been retrofit with retrofit apparatus 700(2). LEDs associated with each PCB 640 emit light designated by light rays 645. Four PCBs 640(3) mount such that light rays 645 are directed upwardly towards housing 660, where they impinge on an inner surface 662 of housing 660, unless optional diffuser 694 is installed, in which case light rays impinge on diffuser 694. Diffuser 694 need not completely reflect light incident thereon (e.g., diffuser 694 may be made of a translucent material) and surface 662 may be reflective or coated with a reflective color (e.g., white) so that any light from PCBs 640(3) that transmits through diffuser 694 is efficiently reflected back downwards from housing 660. PCBs 640(4) mount approximately central within housing 660 and direct respective light rays 645 downwardly.

Whether light emitted by PCBs 640(3) reflects from inner surface 662 or optional diffuser 694 or both, blending and diffusion associated with such reflections helps to minimize user discomfort and/or distraction that may be associated with LEDs that are bright point sources of light. Optional diffuser 690, through which the LED light passes before it exits the light fixture, may be utilized to help further blend and diffuse light emitted by PCBs 640(3); such two stage diffusion may be particularly helpful in minimizing user discomfort and/or distraction. Optional diffuser 692, when present, further blends and diffuses light from PCBs 640(4); thus when utilized with optional diffuser 690, the light from PCBs 640(4) is also blended and diffused in two stages. Bracket 650(2) may form a primary thermal path for conducting heat generated by the LEDs, away from PCBs 640 to housing 660.

Figure 13:
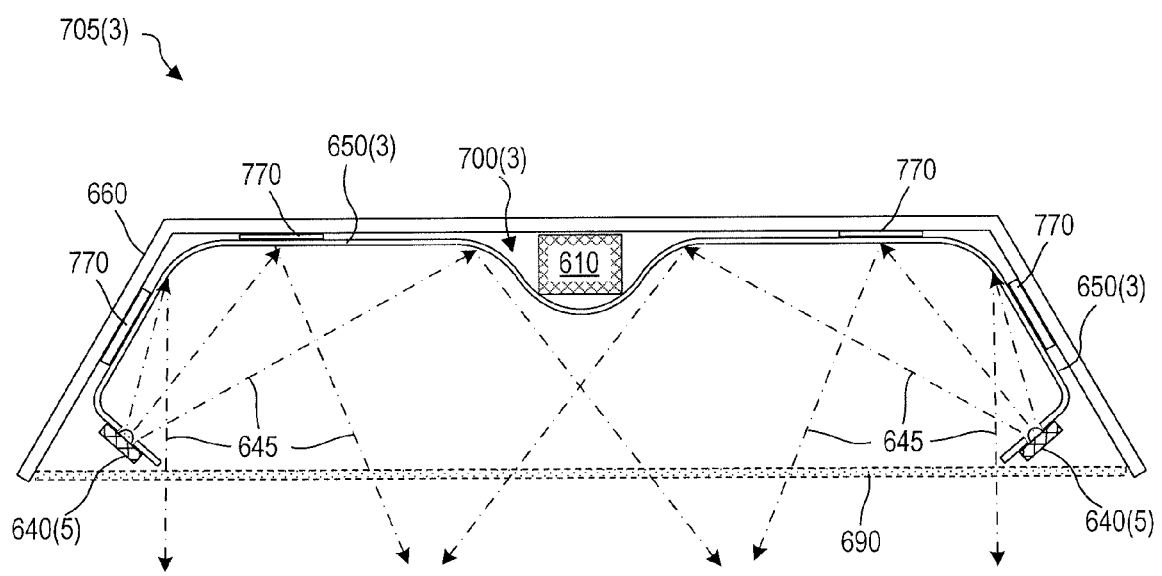
FIG. 13 shows a light fixture in which a housing has been retrofit with a retrofit apparatus, in accord with an embodiment.

FIG. 13 shows a light fixture 705(3) in which a housing 660 has been retrofit with a retrofit apparatus 700(3). LEDs associated with each of two PCBs 640(5) emit light designated by light rays 645. In light fixture 705(3), a bracket 650(3) spans a full width of housing 660 and reflects and diffuses light rays 645; an optional diffuser 690 may also be added, in the same manner as optional diffuser is used in retrofit apparatuses 700(1) and 700(2) (FIG. 11A, 12A respectively). Fasteners 770 may be used to secure bracket 650(3) to top and/or side surfaces of housing 660, as shown. As discussed with respect to fasteners 670 (FIG. 11C), fasteners 770 may be mechanical fasteners, magnets, adhesives, and/or arrangements whereby slots or tabs of bracket 650(3) and/or housing 660 that mate with one another. Fasteners 770 may advantageously facilitate heat transfer from bracket 650(3) to housing 660.

Typically, when heat is generated by a lighting fixture, the heat transfers from point to point within the fixture (and/or objects with which it may be in thermal contact) until the heat eventually transfers to ambient air. Radiative heat transmission from a light fixture to air may therefore play an important role in managing temperature of the fixture and components therein. FIG. 14 is a schematic cross-section of a light bar 730(1) that may be a component of an LED-based lighting system. Light bar 730(1) has a width w and a height h as shown; for light bar 730(1), h and w are equal, that is, light bar 730(1) has a height to width aspect ratio of 1:1. An exemplary PCB 740 and LED 720 are shown proximate to a bottom surface 734 of light bar 730(1); since the view shown in FIG. 13 is a cross-section, light bar 730(1) represents a tube extending in and out of the page while PCB 740 is a strip running along such tube, and having LEDs 720 at intervals thereon. When LED 720 is on, light is emitted downwardly therefrom, as indicated by light rays 745. Heat is generated by LEDs 720 (and/or by other components on PCB 740) and at least some of the heat transfers to a side surface 732 of light bar 730(1) near bottom surface 734. Arrows 750 indicate the magnitude of heat transfer to ambient air at representative locations of side surface 732 (heat transfers from many locations of light bar 730(1); arrows designate only two such locations, for clarity of illustration). When LEDs 720 are on, heat dissipated from LED 720 will raise temperatures at locations adjacent to LED 720 the most, and as the heat spreads, other areas will correspondingly increase in temperature. Since heat transfer is proportional to temperature difference between adjacent points, heat transfer to air will therefore be highest near bottom surface 734 and will diminish further up on side surface 732.

FIG. 15 shows arrows 750 designating magnitude of heat transfer to ambient air at representative locations of light bars 730(1)-730(4), each such light bar having LED light (and heat) sources near a bottom thereof, like LED 720 shown in FIG. 14 (the LED(s) are not shown in FIG. 14, for clarity of illustration). As noted for FIG. 14, light bar 730(1) has a height to width aspect ratio of 1:1; light bars 730(2), 730(3) and 730(4) have height to width aspect ratios of 2:1, 4:1 and 8:1 respectively. Arrows 750(1)-750(4) illustrate the respective magnitudes of heat transfer to ambient air at representative locations of light bars 730(1)-750(4). It can be seen that net heat transfer (visualized as a sum of arrows 750) increases significantly with height to width aspect ratio for light bars 730(1)-730(3), but for light bar 730(4) with a height to width aspect ratio of 8:1, incremental heat transfer near a top of the light bar is small. Since volume, material used, and therefore weight of a light fixture will vary with height to width aspect ratio of light bars used, increasing height to width aspect ratio up to 4:1 (e.g., the aspect ratio of light bar 750(3)) may be advantageous in terms of reducing operating temperature, but increasing height to width aspect ratio to 8:1 may negate this advantage due to such aspect ratio generating an excessively large and heavy fixture without significant further temperature reduction. Accordingly, height to width aspect ratios ranging from 3:1 to 6:1 may be useful choices for light bars 730, and a height to width aspect ratio of 4:1 may be approximately optimal. A height to width aspect ratio such as 4:1 may also have other advantages, such as generating a high ratio of side surface to top and bottom surface of a light fixture. Since, over time, dust and/or other contaminants may settle on a top surface of a light fixture, minimizing top and bottom surface area relative to side surface area may be advantageous.

Changes may be made in thermal management of the LED-based lighting systems described herein without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A light-emitting diode ("LED") based retrofit apparatus for a light fixture, comprising:
    a bracket configured for attachment to the light fixture;
    electronics mounted with the bracket, for converting AC line voltage power to low voltage DC power;
    a first printed circuit board having one or more LEDs mounted thereon, the first printed circuit board mounting with the bracket such that when the first printed circuit board is supplied with the low voltage DC power, the LEDs mounted on the first printed circuit board primarily emit light upwardly into the light fixture, and the light reflects from one or more surfaces and exits the light fixture downwardly;
    a second printed circuit board having one or more LEDs mounted thereon, the second printed circuit board mounting with the bracket such that, when supplied with the low voltage DC power, the LEDs mounted on the second printed circuit board primarily emit light downwardly with respect to the light emitted from the LEDs mounted on the first printed circuit board; and
    a diffuser disposed beneath the second printed circuit board, such that light emitted from the LEDs mounted on the second printed circuit board passes through the diffuser, but the light reflecting from the one or more surfaces does not pass through the diffuser.

2. The LED based retrofit apparatus of claim 1, wherein the one or more surfaces are surfaces of the light fixture.

3. The LED based retrofit apparatus of claim 1, wherein the one or more surfaces are surfaces of the bracket.

4. The LED based retrofit apparatus of claim 1, the one or more surfaces being downwardly concave in shape.

5. The LED based retrofit apparatus of claim 1, the diffuser being a first diffuser, the apparatus further comprising a second diffuser through which the light from both the LEDs mounted on the first printed circuit board, and the LEDs mounted on the second printed circuit board, passes to exit the light fixture.

6. The LED based retrofit apparatus of claim 1, wherein the printed circuit board and bracket form a primary heat dissipation path for the LEDs.

7. A light-emitting diode ("LED") based lighting system, comprising:
    a housing forming one or more apertures;
    a printed circuit board ("PCB") having conductors on a front-side thereof; and
    one or more LEDs mounted with the conductors;
    the PCB being mounted with the conductors proximate to and thermally coupling with a surface of the housing such that the LEDs emit light through the apertures, and heat generated by the one or more LEDs primarily dissipates through the conductors to the housing.

8. The lighting system of claim 7, wherein the conductors occupy at least 50% of a front-side area of the PCB.

9. The lighting system of claim 8, wherein the conductors occupy at least 70% of the front-side area.

10. The lighting system of claim 7, wherein the housing forms a troffer.

11. The lighting system of claim 10, the PCB being mounted with the conductors proximate to and thermally coupling with an outer surface of the housing, and wherein the housing does not enclose the PCB.

12. The lighting system of claim 7, wherein the housing forms one or more vent apertures.

13. The lighting system of claim 12, further comprising a diffuser that forms one or more vent apertures.

14. A light-emitting diode ("LED") based lighting system, comprising:
    a housing having one or more apertures formed therein;
    one or more LEDs mounted in the one or more apertures to emit light through a front surface of the housing;
    a printed circuit board ("PCB") for controlling the LEDs, the PCB mounted on a back surface of the housing, the PCB including one or more electrical conductors that supply power to the one or more LEDs;
    wherein the one or more electrical conductors thermally couple directly with the housing such that more heat generated by the LEDs dissipates through the one or more electrical conductors into the housing as compared to dissipation through other thermal paths.

15. The lighting system of claim 14, wherein the electrical conductors occupy at least 50% of a front-side area of the printed circuit board.

16. The lighting system of claim 15, wherein the conductors occupy at least 70% of the front-side area.

17. The lighting system of claim 14,
the housing being substantially two sided, the light being emitted so as to radiate away from the front surface, the back surface being an outer surface that faces away from the front surface;
the one or more apertures being formed through the housing; and
the one or more LEDs being mounted on the PCB such that when the PCB is mounted on the back surface of the housing, the one or more LEDs are mounted in the one or more apertures.

* * * * *